(12) United States Patent
Abe et al.

(10) Patent No.: US 8,680,887 B2
(45) Date of Patent: Mar. 25, 2014

(54) NONVOLATILE CONFIGURATION MEMORY

(75) Inventors: Keiko Abe, Yokohama (JP); Shinichi Yasuda, Tokyo (JP); Kumiko Nomura, Tokyo (JP); Shinobu Fujita, Inagi (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/419,205

(22) Filed: Mar. 13, 2012

(65) Prior Publication Data

US 2012/0235705 A1 Sep. 20, 2012

(30) Foreign Application Priority Data

Mar. 15, 2011 (JP) .................................. 2011-057132

(51) Int. Cl.
*H03K 19/177* (2006.01)
*G11C 11/34* (2006.01)
*G11C 16/04* (2006.01)
*G11C 11/00* (2006.01)

(52) U.S. Cl.
USPC .......................... 326/39; 365/189.05; 365/154

(58) Field of Classification Search
USPC .................... 326/39, 105, 119; 327/407–410; 365/154, 189.07, 156
See application file for complete search history.

(56) References Cited

U.S. PATENT DOCUMENTS

| | | | |
|---|---|---|---|
| 5,812,450 | A | 9/1998 | Sansbury et al. |
| 7,245,535 | B2 | 7/2007 | McCollum et al. |
| 2007/0008781 | A1* | 1/2007 | Jono et al. ................ 365/185.23 |
| 2009/0129162 | A1* | 5/2009 | Poplevine et al. ....... 365/185.08 |
| 2011/0216573 | A1 | 9/2011 | Abe et al. |
| 2012/0096323 | A1* | 4/2012 | Tachibana ..................... 714/719 |

FOREIGN PATENT DOCUMENTS

| | | |
|---|---|---|
| JP | 6-76582 A | 3/1994 |
| JP | 6-325582 A | 11/1994 |
| JP | 7-272490 A | 10/1995 |
| JP | 8-509091 H | 9/1996 |
| JP | 2000-123591 A | 4/2000 |
| JP | 2005-303990 A | 10/2005 |
| JP | 2007-531958 A | 11/2007 |
| WO | 03-105156 A1 | 12/2003 |

OTHER PUBLICATIONS

First Japanese Office Action (with English translation) dated Feb. 5, 2013 from corresponding JP Application No. 2011-057132, 9 pages.

* cited by examiner

*Primary Examiner* — Alexander H Taningco
*Assistant Examiner* — Dylan White
(74) *Attorney, Agent, or Firm* — Ohlandt, Greeley, Ruggiero and Perle, L.L.P.

(57) ABSTRACT

According to one embodiment, a memory includes a first P-channel FET having a gate connected to a second output node, a source applied to a first potential, and a drain connected to the first output node, a second P-channel FET having a gate connected to a first output node, a source applied to the first potential, and a drain connected to the second output node, a first N-channel FET having a control gate connected to a first word line, a source applied to a second potential lower than the first potential, a drain connected to the first output node, and a threshold changed by data in a storage layer, and a second N-channel FET having a control gate connected to a second word line, a source applied to the second potential, a drain connected to the second output node, and a threshold changed by data in a storage layer.

11 Claims, 11 Drawing Sheets

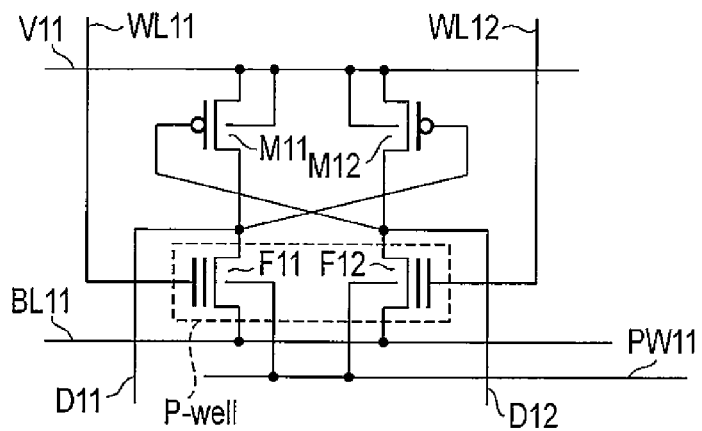
F I G. 1
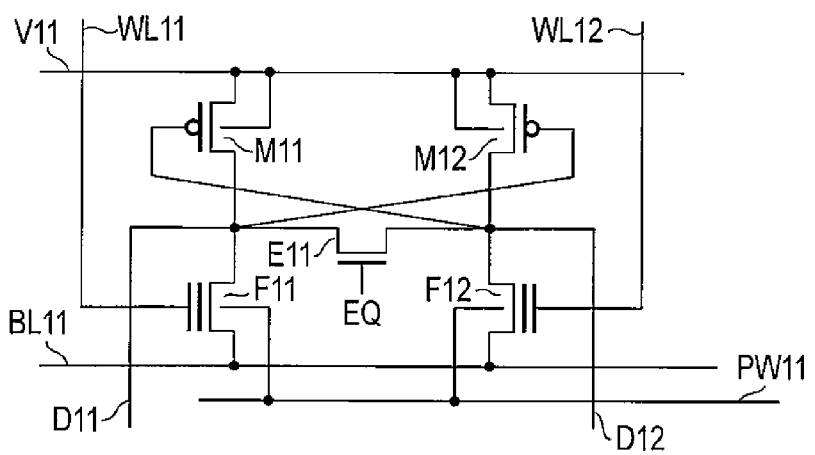
F I G. 2
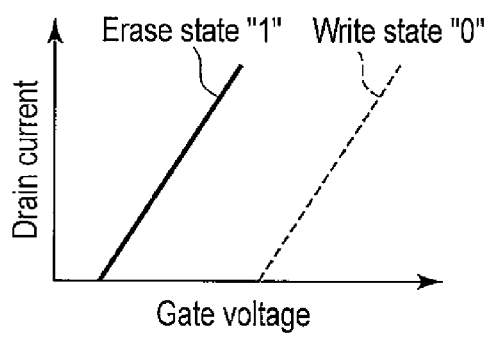
F I G. 3

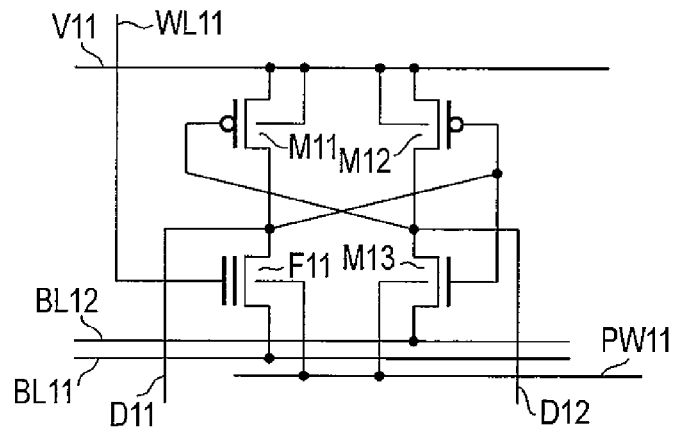
F I G. 4
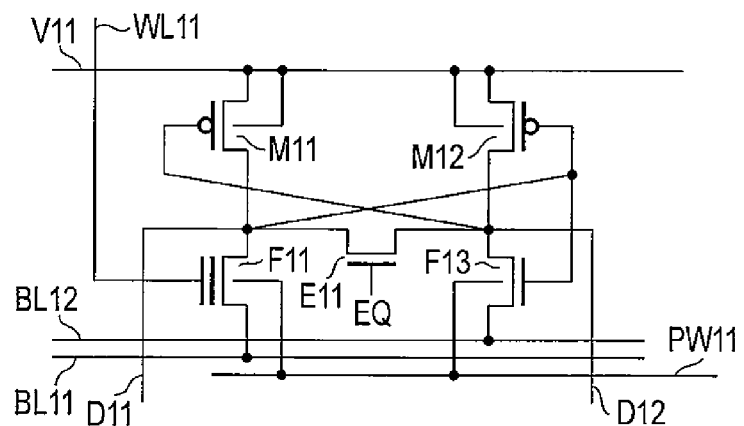
F I G. 5
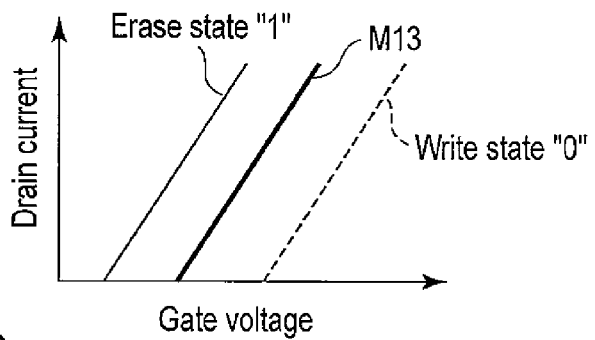
F I G. 6

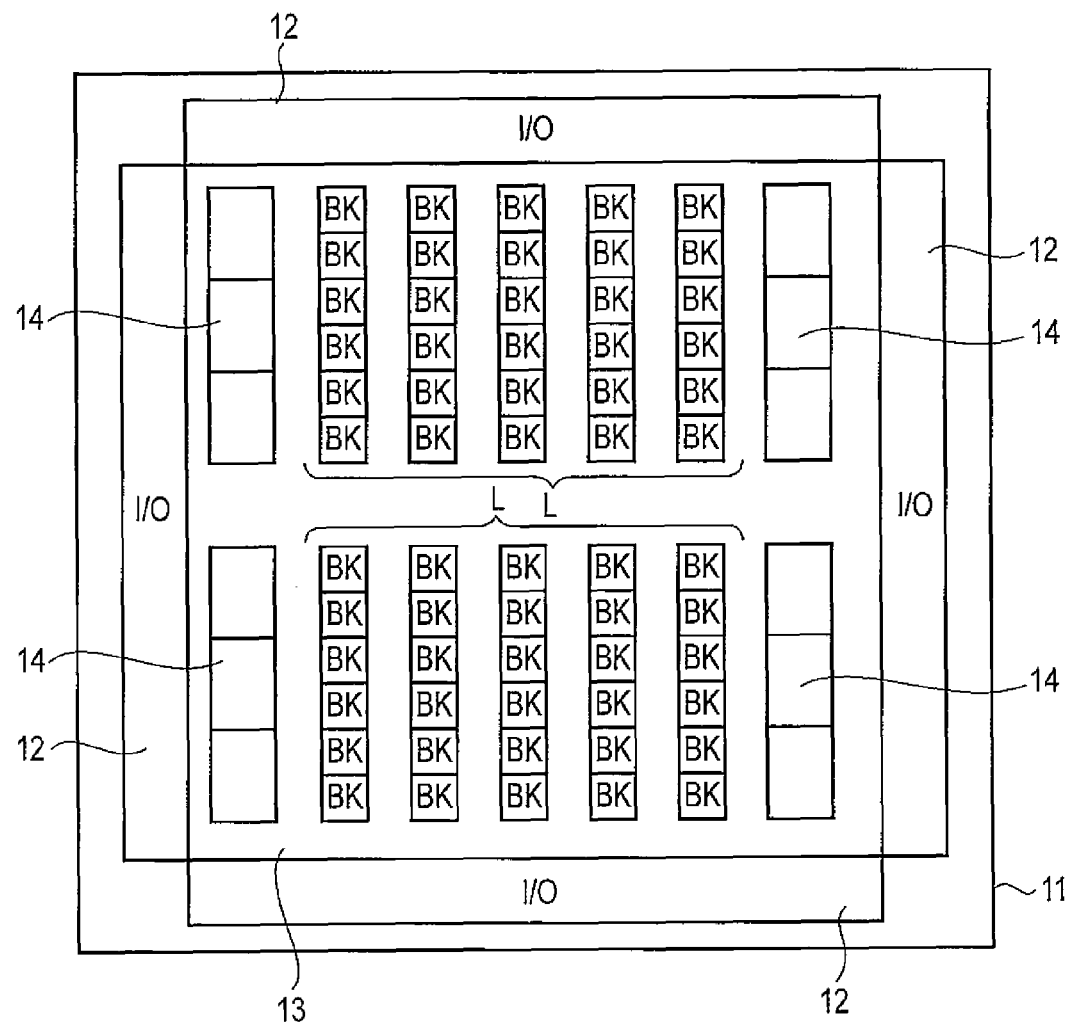
F I G. 7

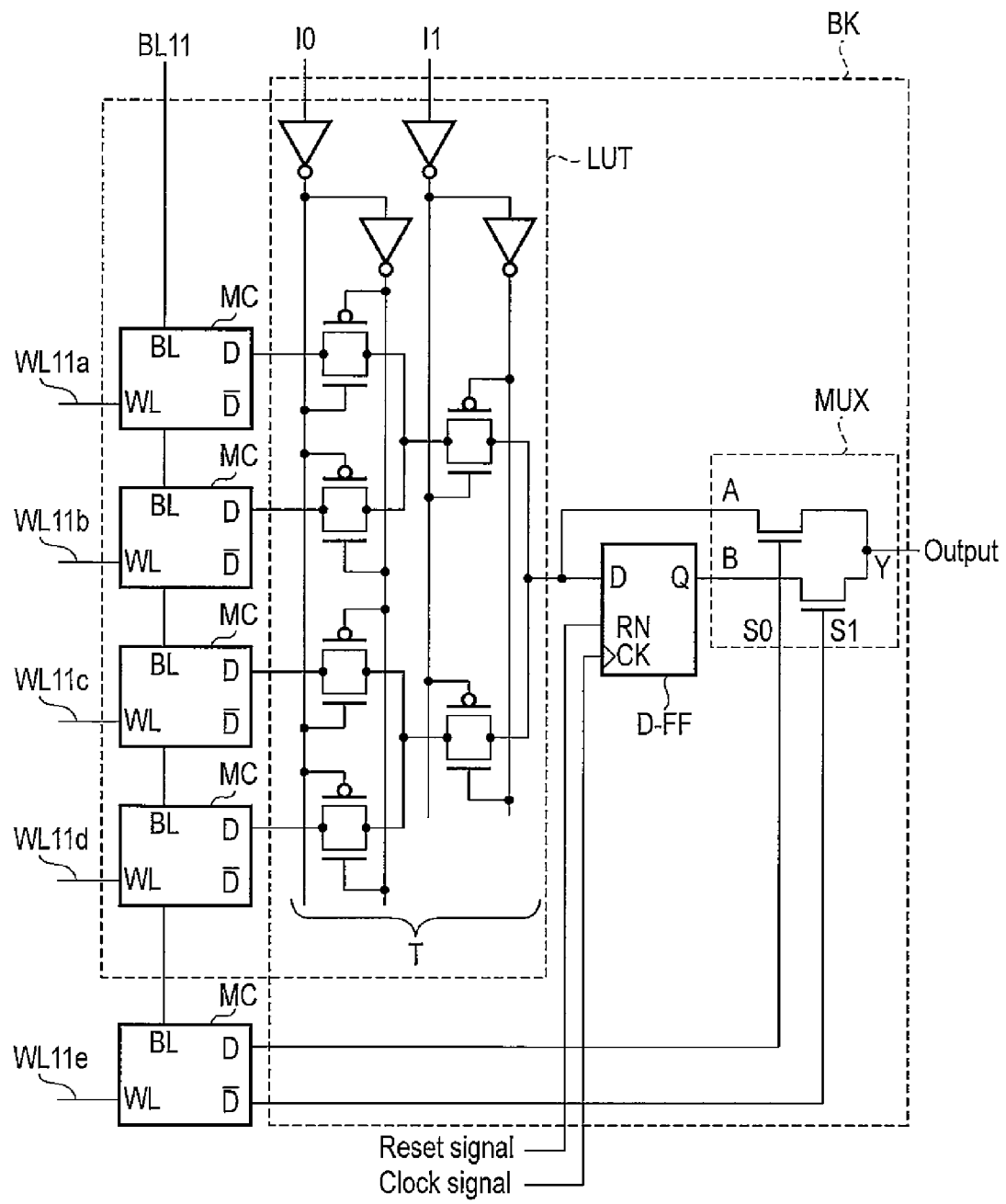
F I G. 14

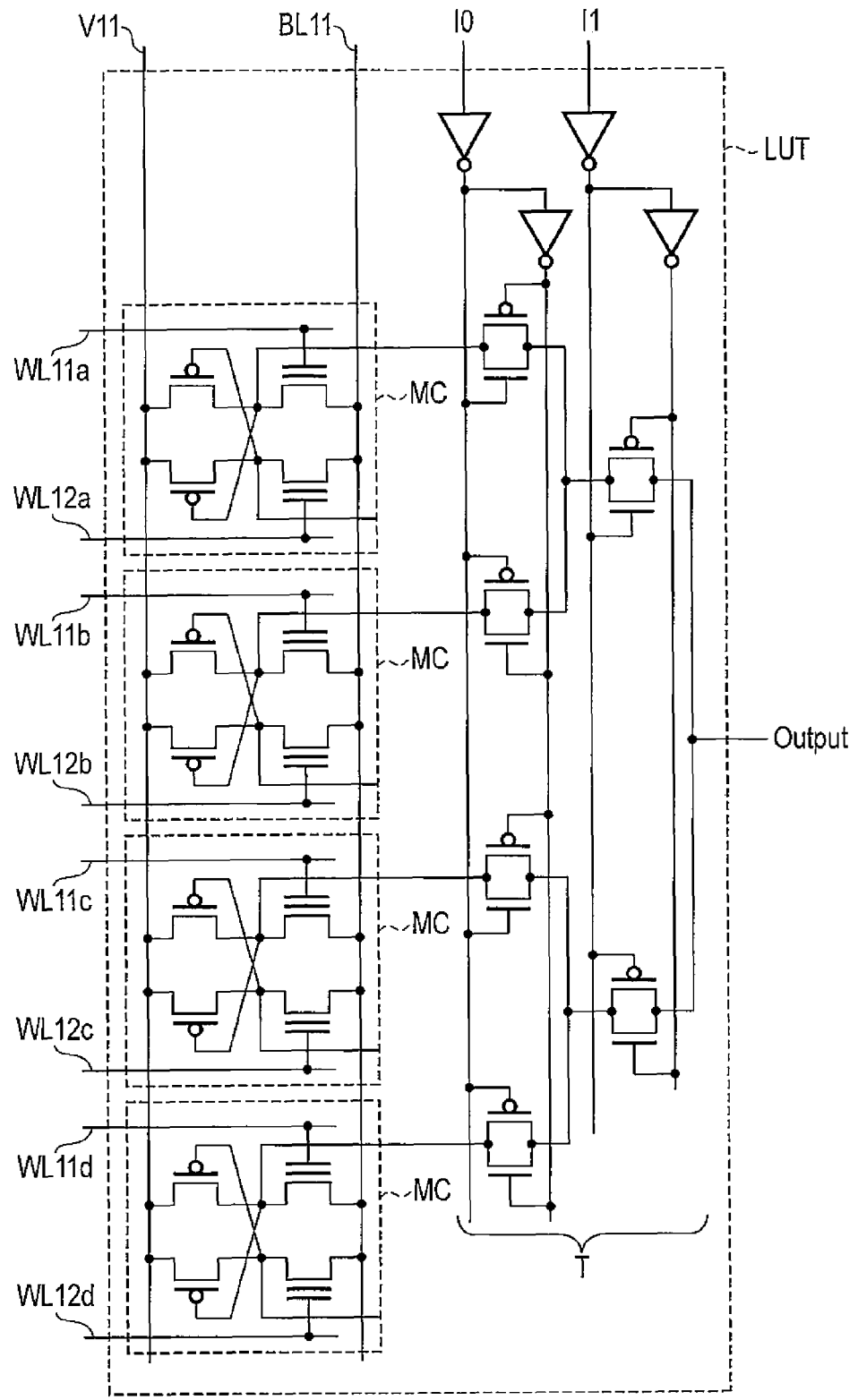
F I G. 15

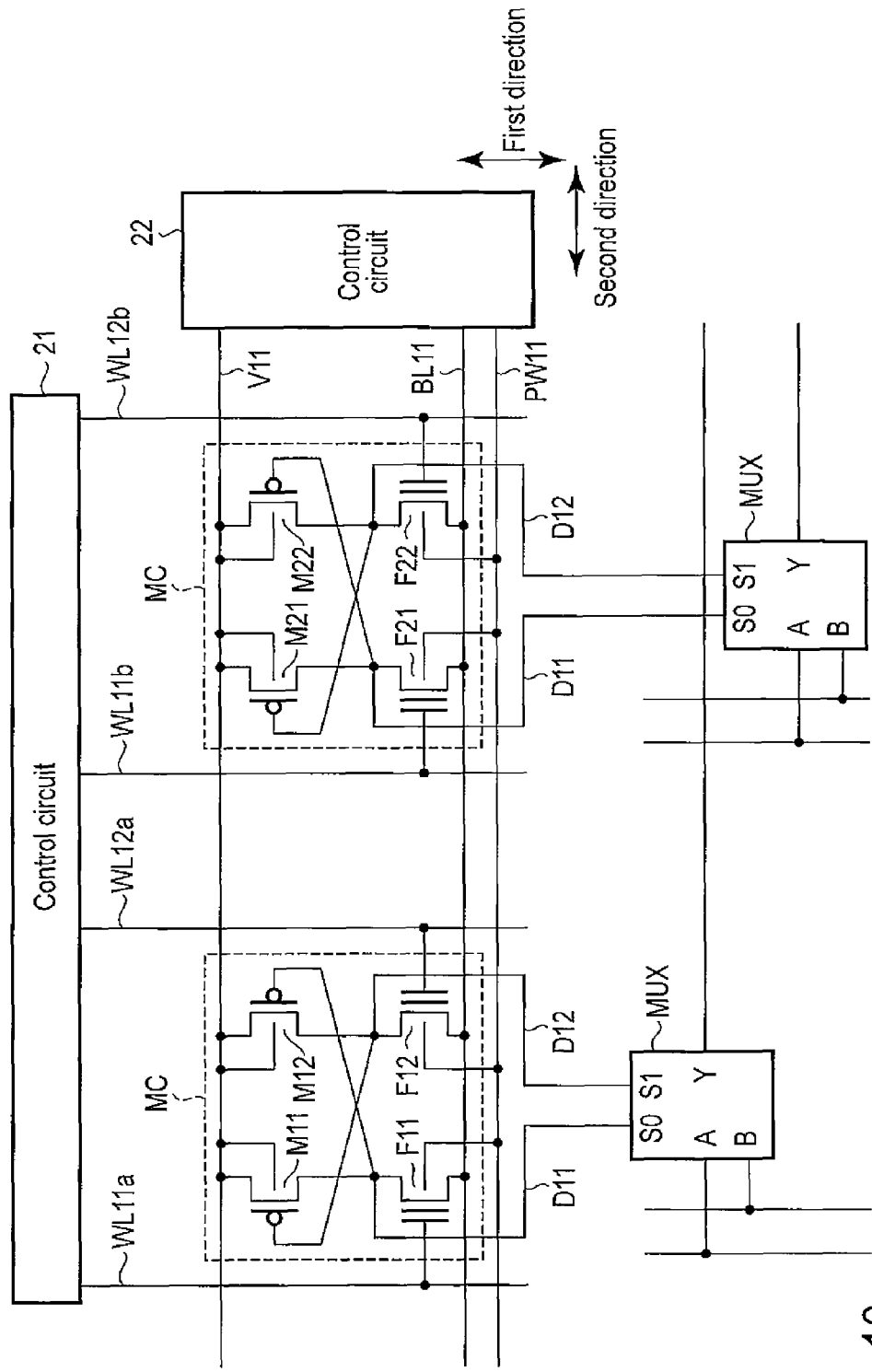
F I G. 16

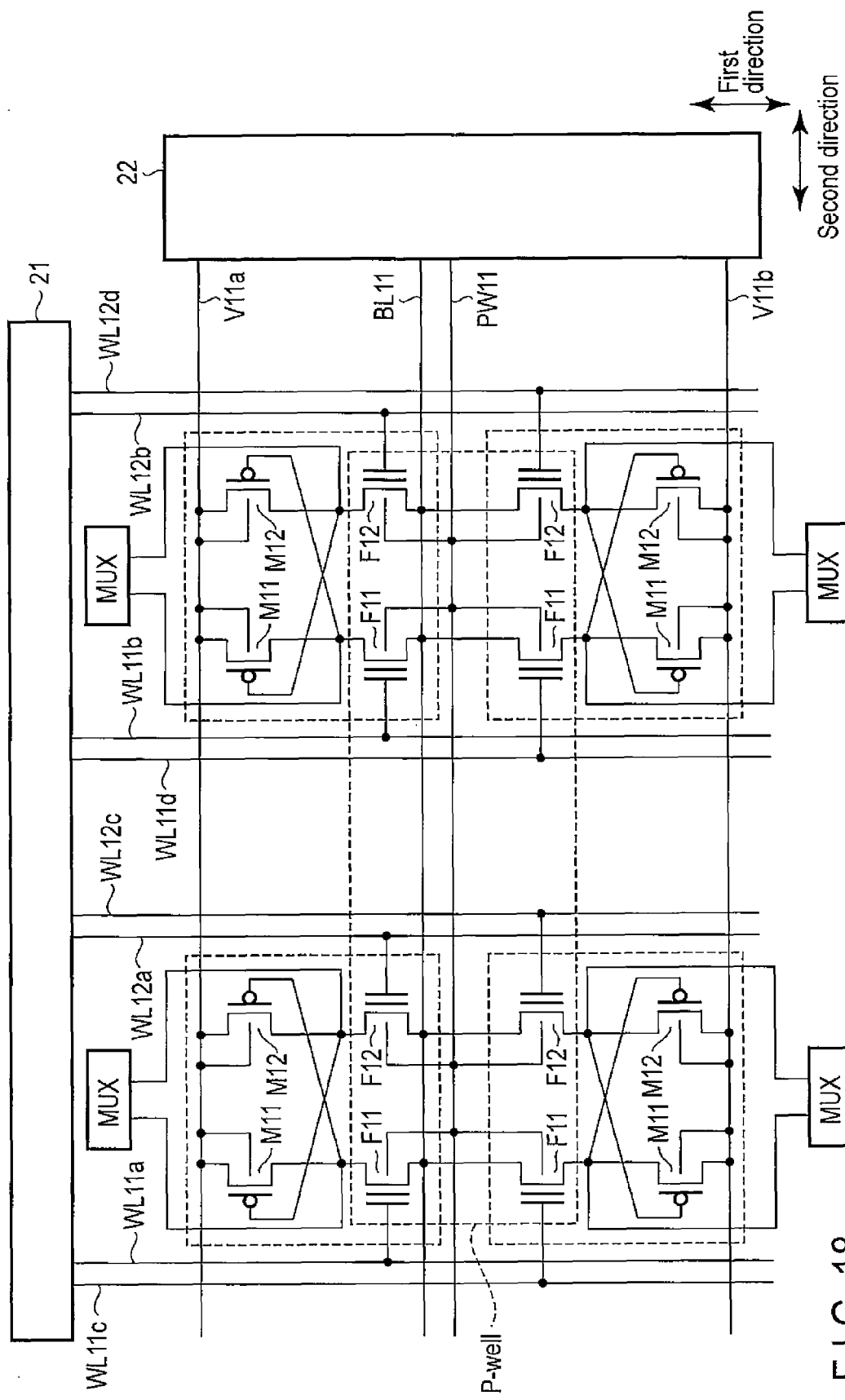
F I G. 18

NONVOLATILE CONFIGURATION MEMORY

CROSS-REFERENCE TO RELATED APPLICATIONS

This application is based upon and claims the benefit of priority from prior Japanese Patent Application No. 2011-057132, filed Mar. 15, 2011, the entire contents of which are incorporated herein by reference.

FIELD

Embodiments described herein relate generally to a nonvolatile configuration memory.

BACKGROUND

A field-programmable gate array (FPGA) is an LSI includes logic gates of a lookup table (LUT) base and a switch which connects the gates. The FPGA rewrites memory information which controls the LUT and the switch, which enables the construction of an arbitrary circuit. According to the FPGA, a user can rewrite a desirable circuit after the shipping of chips, and hence it is possible to shorten a development period of time for manufacturing the chips.

A memory which controls the on/off state of the switch of the FPGA is called a configuration memory, and an SRAM cell is mainly used. On the other hand, the switch is often used as a multiplexer. In this case, two types of a positive signal and an inversion signal are required for the control of the switch. Consequently, the SRAM cell which can take out the positive signal and the inversion signal in parallel is suitable for this use application.

However, the SRAM cell consists of six transistors, as is well known, and hence its area is large. Moreover, the SRAM cell is a volatile memory from which data disappears when the power is removed. Therefore, after the power is restored, it is necessary to reread the memory data.

Therefore, nonvolatile configuration memories have been suggested.

For example, a nonvolatile configuration memory consisting of two transistors including floating gates is known. According to this memory, it is unnecessary to reread the memory data after the power is restored. Moreover, the memory cell consists of two transistors, and hence the area thereof can be advantageously restrained.

However, when a high signal is output from the memory cell, the output level does not rise to the supply potential. Therefore, the switch controlled by this output cannot be sufficiently turned on. Consequently, there is a problem that power consumption of a logic circuit connected to a latter part of the switch becomes large.

Moreover, this memory cell outputs the positive signal only. Therefore, when this cell is used as the configuration memory of the multiplexer, an inverter for generating the inversion signal is required in addition to the memory cell. That is, according to this technology, the memory cell requires two transistors and further requires two transistors for generating the inversion signal, and consequently, four transistors in total are required. Therefore, sufficient area reduction cannot be achieved.

On the other hand, there is known a nonvolatile configuration memory in which an N-channel MOS transistor for driving in an SRAM cell is replaced with a nonvolatile memory cell (a transistor including a floating gate). According to this memory, a high output level rises to the supply potential, which eliminates the problem of increased power requirements of the logic circuit connected to the latter part of the switch.

However, this memory cell consists of six transistors, and hence to the goal of decreasing cell area remains unachieved. Moreover, in writing to the transistor including the floating gate, it is necessary to apply a high potential for writing to the gate electrode of the transistor. Consequently, an N-channel MOS transistor for access in the SRAM cell has to be provided with a high withstand pressure, and an area of the transistor becomes large.

Furthermore, the gate electrode of a P-channel MOS transistor for loading in the SRAM cell is connected to the gate electrode of the transistor including the floating gate in the SRAM cell. Consequently, the P-channel MOS transistor for loading has also to be provided with the high withstand pressure so that the transistor is not broken by the high potential for writing, and hence the area of the transistor becomes large.

BRIEF DESCRIPTION OF THE DRAWINGS

FIG. 1 is a circuit diagram showing a memory cell of a first embodiment;

FIG. 2 is a circuit diagram showing a modification example of the first embodiment;

FIG. 3 is a diagram showing the relationship between an erase state and a write state;

FIG. 4 is a circuit diagram showing a memory cell of a second embodiment;

FIG. 5 is a circuit diagram showing a modification example of the second embodiment;

FIG. 6 is a diagram showing the relationship between an erase state and a write state;

FIG. 7 is a plan view showing an FPGA of a third embodiment;

FIG. 14 is a diagram showing a lookup table in a logic block;

FIG. 15 is a diagram showing the lookup table; and

FIG. 16 to FIG. 18 are diagrams showing examples of a memory cell array.

DETAILED DESCRIPTION

Figure 8:
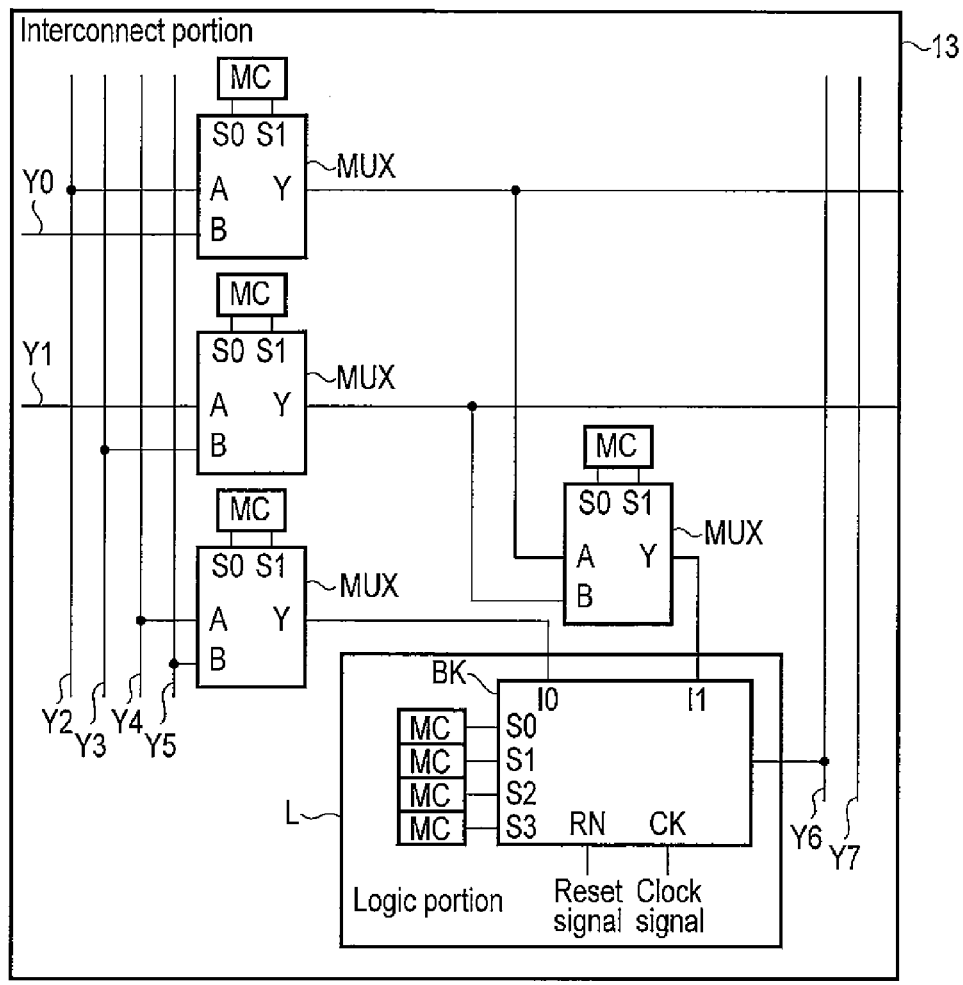
FIG. 8 is a diagram showing the relationship between an interconnect portion and a logic portion.

In general, according to one embodiment, a nonvolatile configuration memory comprising: first and second output nodes; a first P-channel FET having a gate connected to the second output node, a source applied to a first potential, and a drain connected to the first output node; a second P-channel FET having a gate connected to the first output node, a source applied to the first potential, and a drain connected to the second output node; a first N-channel FET having a control gate connected to a first word line, a source applied to a second potential lower than the first potential, a drain connected to the first output node, and a storage layer which stores data changed a threshold value of the first N-channel FET in a nonvolatile manner; and a second N-channel FET having a control gate connected to a second word line, a source applied to the second potential, a drain connected to the second output node, and a storage layer which stores data changed a threshold value of the second N-channel FET in a nonvolatile manner.

Hereinafter, the embodiments will be described with reference to the drawings.

[Basic Constitution]

In a nonvolatile configuration memory of the embodiment, a volatile memory cell (a SRAM cell) is formed by cross-coupling two inverters, and at least one of these inverters includes a P-channel field-effect transistor (FET) and a non-volatile memory (for example, a flash memory). Consequently, an output signal from the memory cell can fully be swung, to realize the nonvolatile configuration memory with low power requirements.

Moreover, unlike a conventional SRAM cell, the nonvolatile configuration memory of the embodiment does not require any transfer transistor (an N-channel FET for access), and consequently, the memory includes four transistors. Additionally, a control gate of the nonvolatile memory is not connected to an output node of the volatile memory cell including the two cross-coupled inverters.

This means that when data is written in the nonvolatile memory, a programming potential (a high potential) is applied only to the control gate of the nonvolatile memory, and this programming potential is not applied to the gate electrode of the P-channel FET. Therefore, it is not necessary to form the P-channel FET as a high withstand pressure type so that the FET is not broken by the programming potential, and consequently, the nonvolatile configuration memory having a small area can be realized.

First Embodiment

A first embodiment relates to a nonvolatile configuration memory.

FIG. 1 shows the first embodiment.

This nonvolatile configuration memory includes two cross-coupled inverters (a volatile memory cell). From this volatile memory cell, a positive signal and an inversion signal can be taken out in parallel through first and second output nodes D11 and D12.

The gate of first P-channel MOS transistor M11 is connected to second output node D12, the source thereof is connected to a first potential node (for example, a supply potential node) V11 to which a first potential is applied, and the drain thereof is connected to the first output node D11.

The gate of second P-channel MOS transistor M12 is connected to the first output node D11, the source thereof is connected to the first potential node V11, and the drain thereof is connected to the second output node D12.

First and second N-channel MOS transistors F11 and F12 are nonvolatile memories each including a storage layer between a control gate and a gate insulating layer, and threshold values of the memories change in accordance with data stored in the storage layers in a nonvolatile manner.

The control gate of the first N-channel MOS transistor F11 is connected to a first word line WL11, the source thereof is connected to a second potential node (for example, a ground node) BL11 to which a second potential lower than the first potential is applied, and the drain thereof is connected to the first output node D11.

The control gate of the second N-channel MOS transistor F12 is connected to a second word line WL12, the source thereof is connected to the second potential node BL11, and the drain thereof is connected to the second output node D12.

As first and second N-channel MOS transistors (nonvolatile memories) F11 and F12, there can be used, for example, flash memories each including, in the storage layer, a floating gate having an electrically floating state or a charge accumulation layer which locally traps a charge. Moreover, an inventive memory using a resistance-change element in the storage layer can be used as the nonvolatile memory.

Characteristics of this volatile memory cell (the SRAM cell) lie in that the nonvolatile memories are used as first and second N-channel MOS transistors F11 and F12, the control gate of the first N-channel MOS transistor F11 is not connected to the second output node D12, and the control gate of the second N-channel MOS transistor F12 is not connected to the first output node D11.

Moreover, erase/write with respect to first and second N-channel MOS transistors (nonvolatile memories) F11 and F12 is taken into consideration, so that P-type well region (P-well) provided with the transistors is connected to a third potential node PW11 to which a predetermined potential is applied.

According to the above constitution, first and second P-channel MOS transistors M11 and M12 are not used as the nonvolatile memories, whereby an output signal from the memory cell can fully be swung (for example, from ground potential of 0 V to supply potential Vdd), and the nonvolatile configuration memory with low power requirements can be realized.

Moreover, when writing to the nonvolatile memories, a programming potential (a high potential) is applied only to the control gates of the nonvolatile memories, and this programming potential is not applied to the gate electrodes of first and second P-channel MOS transistors M11 and M12, so that the nonvolatile configuration memory having a small area can be realized.

It is to be noted that as shown in FIG. 2, between the first output node D11 and the second output node D12, a MOS transistor E11 which equalizes both potentials may be connected. Into the gate of the MOS transistor E11, equalizing signal EQ is input. The MOS transistor E11 has, for example, a function of equalizing the potentials of first and second output nodes D11 and D12 before the nonvolatile memories are read.

Moreover, the MOS transistor constituting the above-mentioned nonvolatile configuration memory is an example, and this transistor can be generalized in a field effect transistor (FET) including the gate, the source and the drain.

Next, there will be described erase/write with respect to first and second N-channel MOS transistors (nonvolatile memories) F11 and F12.

First, examples of threshold states of first and second N-channel MOS transistors F11 and F12 will be described. For example, a state where the threshold is low is the erase state, and a state where the threshold is high is the write state, as shown in the relationship between the control gate potential and drain current of FIG. 3.

When the nonvolatile memories are the flash memories each including the floating gate, the erase state means a state where electrons are extracted from the storage layers, and the write state means a state where the electrons are placed in the storage layers.

A threshold magnitude correlation between the erase state and the write state is the erase state<the write state. Therefore, when the same potential is applied to the control gate, a resistance magnitude correlation between the erase state and the write state becomes the erase state<the write state.

When the above threshold correlation is present, the erase from first and second N-channel MOS transistors (nonvolatile memories) F11 and F12 is performed, for example, by applying ground potential Vgnd to first and second word lines WL11 and WL12 and applying erase potential Vera (a high positive potential of, for example, 18 V) to third potential node (P-type well region P-well) PW11.

At this time, first and second potential nodes V11 and BL11 are, for example, made to float.

Consequently, the electrons are extracted from the storage layers of first and second N-channel MOS transistors F11 and F12, and both the transistors become the erase state.

Moreover, the write in first and second N-channel MOS transistors (nonvolatile memories) F11 and F12 is executed by putting one of first and second N-channel MOS transistors F11 and F12 into the write state and putting the other transistor into the erase state. That is, the write is performed by writing complementary data in the storage layers of first and second N-channel MOS transistors F11 and F12.

For example, when programming potential Vpgm (a high positive potential of, for example, 18 V) is applied to first word line WL11, ground potential Vgnd is applied to second word line WL12 and also to third potential node (P-type well region P-well) PW11, the electrons are implanted in the storage layer of first N-channel MOS transistor F11, and the transistor attains the write state.

That is, the write is executed only in first N-channel MOS transistor F11, and second N-channel MOS transistor F12 maintains the erase state.

It should be noted that first and second potential nodes V11 and BL11 are, for example, made to float.

According to the above operation, there is performed the erase/write with respect to first and second N-channel MOS transistors (nonvolatile memories) F11 and F12.

Second Embodiment

A second embodiment also relates to a nonvolatile configuration memory.

FIG. 4 shows the second embodiment.

As compared with the first embodiment, the second embodiment has characteristics that one of two cross-coupled inverters includes a P-channel MOS transistor and a nonvolatile memory (for example, a flash memory).

The gate of first P-channel MOS transistor M11 is connected to a second output node D12, the source thereof is connected to a first potential node (for example, a supply potential node) V11 to which a first potential is applied, and the drain thereof is connected to a first output node D11.

The gate of a second P-channel MOS transistor M12 is connected to the first output node D11, the source thereof is connected to the first potential node V11, and the drain thereof is connected to the second output node D12.

First N-channel MOS transistor F11 is a nonvolatile memory which includes a storage layer between a control gate and a gate insulating layer and whose threshold changes in accordance with data stored in the storage layer in a nonvolatile manner.

The control gate of first N-channel MOS transistor F11 is connected to a word line WL11, the source thereof is connected to second potential node (for example, a ground node) BL11 to which a second potential lower than the first potential is applied, and the drain thereof is connected to the first output node D11.

The gate of second N-channel MOS transistor M13 is connected to the first output node D11, the source thereof is connected to a fourth potential node (for example, a ground node) BL12 to which the second potential lower than the first potential is applied, and the drain thereof is connected to second output node D12.

As first N-channel MOS transistor (nonvolatile memory) F11, there can be used, for example, a flash memory including, in the storage layer, a floating gate having an electrically floating state or a charge accumulation layer which locally traps a charge. Moreover, an inventive memory using a resistance-change element in the storage layer can be used as the nonvolatile memory.

Characteristics of this volatile memory cell (the SRAM cell) lies in that the nonvolatile memory is used in the first N-channel MOS transistor F11, and the control gate of first N-channel MOS transistor F11 is not connected to the second output node D12.

Moreover, erase/write with respect to the first N-channel MOS transistor (nonvolatile memory) F11 is taken into consideration, so that P-type well region P-well provided with the transistor is connected to a third potential node PW11 to which a predetermined potential is applied.

According to the above constitution, first and second P-channel MOS transistors M11 and M12 are not used as the nonvolatile memories, whereby an output signal from the memory cell can fully be swung (for example, from ground potential of 0 V to supply potential Vdd), and the nonvolatile configuration memory with low power requirements can be realized.

Moreover, when writing to the nonvolatile memory, a programming potential (a high potential) is applied only to the control gate of the nonvolatile memory, and this programming potential is not applied to the gate electrodes of first and second P-channel MOS transistors M11 and M12 and second N-channel MOS transistor M13, so that the nonvolatile configuration memory having a small area can be realized.

It should be noted that as shown in FIG. 5, between the first output node D11 and the second output node D12, MOS transistor E11 which equalizes both potentials may be connected. Into the gate of MOS transistor E11, equalizing signal EQ is input. MOS transistor E11 has, for example, a function of equalizing the potentials of first and second output nodes D11 and D12 before the reading from the nonvolatile memory.

Moreover, the MOS transistor constituting the above-mentioned nonvolatile configuration memory is an example, and this transistor can be generalized in an FET including the gate, the source and the drain.

Next, there will be described the erase/write with respect to the first N-channel MOS transistor (nonvolatile memory) F11.

First, an example of a threshold state of the first N-channel MOS transistor F11 will be described. For example, a state where the threshold is low is an erase state, and a state where the threshold is high is a write state, as shown in the relationship between the control gate potential and drain current of FIG. 6.

When the nonvolatile memory is the flash memory including the floating gate, the erase state means a state where electrons are extracted from the storage layer, and the write state means a state where the electrons are injected into the storage layer.

The threshold magnitude correlation between the erase state and the write state is erase state<write state. Therefore, the threshold (relationship between the gate potential and the drain current) of the second N-channel MOS transistor M13 is set to a value between the erase state and the write state of the first N-channel MOS transistor F11.

That is, the magnitude correlation between the resistances of the erase state and write state of the first N-channel MOS transistor F11 and the resistance of the second N-channel MOS transistor M13 becomes erase state (F11)<resistance of M13<write state (F11).

When the above threshold correlation is present, the first N-channel MOS transistor (nonvolatile memory) F11 is erased, for example, by applying ground potential Vgnd to word line WL11 and applying erase potential Vera (a high positive potential of, for example, 18 V) to third potential node (P-type well region P-well) PW11.

At this time, first, second and fourth potential nodes V11, BL11 and BL12 are, for example, made to float.

Consequently, the electrons are extracted from the storage layer of first N-channel MOS transistor F11, and both the transistors become the erase state.

Moreover, the write in first N-channel MOS transistor (nonvolatile memory) F11 is performed, for example, by applying programming potential Vpgm (a high positive potential of, for example, 18 V) to the word line WL11 and applying ground potential Vgnd to the third potential node (P-type well region P-well) PW11.

At this time, first, second and fourth potential nodes V11, BL11 and BL12 are, for example, made to float.

Consequently, the electrons are implanted in the storage layer of first N-channel MOS transistor F11, and this transistor becomes the write state.

According to the above operation, there is performed the erase/write with respect to the first N-channel MOS transistor (nonvolatile memory) F11.

Third Embodiment

A third embodiment relates to application examples of the nonvolatile configuration memories according to the above first and second embodiments.

The nonvolatile configuration memories of the first and second embodiments can be applied to, for example, a configuration memory of a multiplexer in an FPGA.

FIG. 7 shows an example of a layout of the FPGA.

FPGA 11 mainly includes input/output (I/O) portions 12, logic portions L, interconnect portion 13, and digital signal processor (DSP)/block RAM portions 14. Along the outer periphery of FPGA (chip) 11, I/O portions 12 are arranged, and a large part of the chip is occupied by logic portions L and interconnect portion 13. Interconnect portion 13 interconnects logic blocks BK in logic portions L.

It should be noted that DSP/block RAM portions 14 can be omitted, but in general, more products including the portions are present.

FIG. 8 shows the relationship between logic portion L and interconnect portion 13 of FIG. 7.

Input signals I0 and I1 from interconnect portion 13 is input into logic block BK of logic portion L, and output signal O of logic block BK is output through signal lines Y6 and Y7 in interconnect portion 13. Logic block BK is controlled by, for example, data (for example, an only positive signal) from nonvolatile configuration memories (memory cells) MC according to the first and second embodiments.

Multiplexers MUX in interconnect portion 13 selectively output, for example, input signals through signal lines Y0 to Y5. Multiplexers MUX are controlled by, for example, data (for example, the positive signal and an inversion signal thereof) from nonvolatile configuration memories (memory cells) MC according to the first and second embodiments.

FIG. 9 to FIG. 12 show examples of the nonvolatile configuration memory and the multiplexer, respectively.

Figure 9:
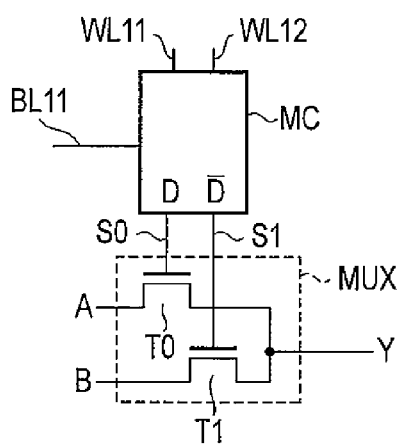
FIG. 9 to FIG. 13 are diagrams each showing the relationship between the memory cell and a multiplexer.
Figure 10:
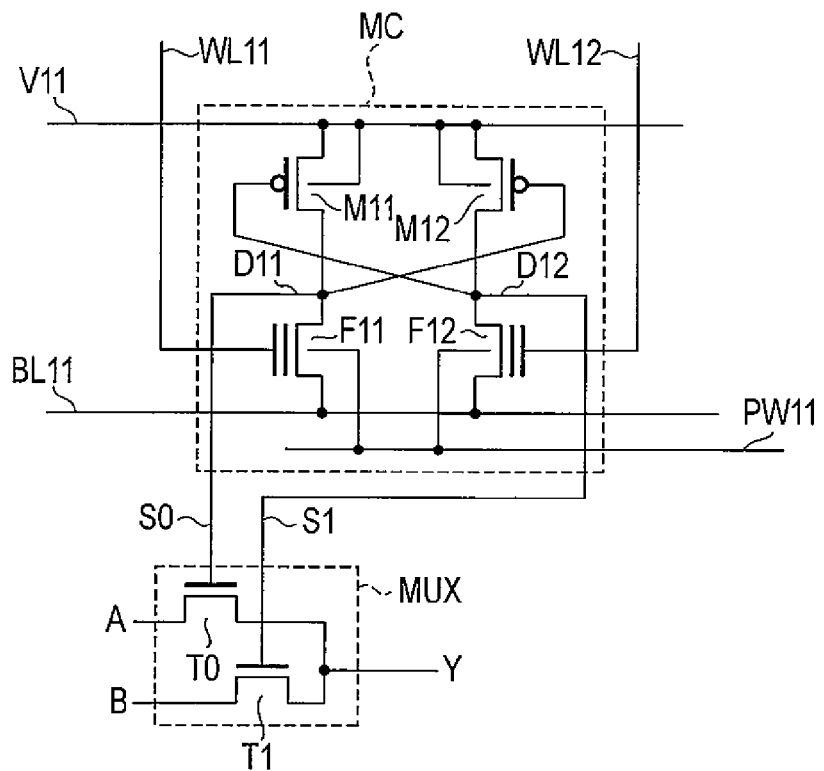

The example of FIG. 9 and FIG. 10 is a system including nonvolatile configuration memory (memory cell) MC of the first embodiment, and two-input multiplexer MUX controlled by an output of the memory. A constitution of memory cell MC has already been described in the first embodiment, and hence the description is omitted here.

Two-input multiplexer MUX outputs one of two input signals A and B as output signal Y. The selection of one from two input signals A and B is controlled by data (positive signal S0 and inversion signal S1 thereof) from memory cell MC.

Here, a read from N-channel MOS transistors (nonvolatile memories) F11 and F12 is performed, for example, by applying read potential Vread to first and second word lines WL11 and WL12 in a state where first potential node V11 is set to the supply potential and second potential node BL11 is set to ground potential.

Read potential Vread is set so that a large current flows when N-channel MOS transistors F11 and F12 are in the erase state and a current hardly flows when N-channel MOS transistors F11 and F12 are in the write state.

Consequently, one of first and second output nodes D11 and D12 goes high (for example, attains supply potential), and the other node goes low (for example, is grounded).

Thus, the data stored in first and second N-channel MOS transistors F11 and F12 in a nonvolatile manner is read, and this data is stored, in a volatile manner, in memory cell MC including first and second P-channel MOS transistors M11 and M12 and first and second N-channel MOS transistors F11 and F12.

It should be noted that in the present example, each of pass transistors T0 and T1 in two-input multiplexer MUX includes an N-channel MOS transistor, but in place of this constitution, there may be used, for example, a transfer gate including a P-channel MOS transistor and an N-channel MOS transistor.

Figure 11:
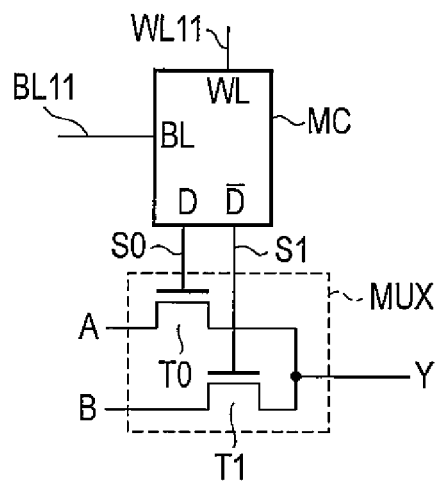
Figure 12:
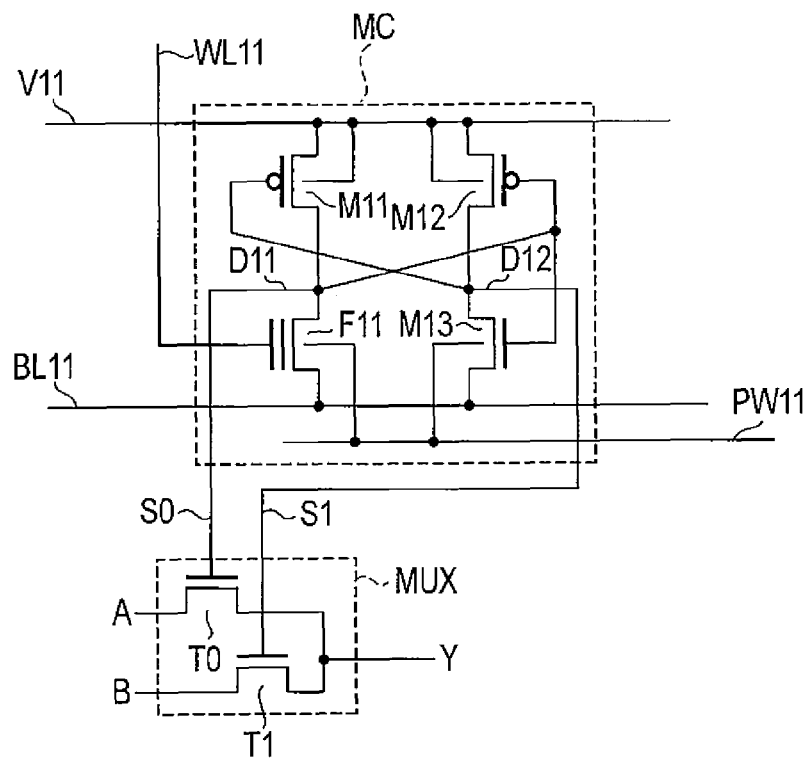

The example of FIG. 11 and FIG. 12 is a system including nonvolatile configuration memory (memory cell) MC of the second embodiment, and two-input multiplexer MUX controlled by an output of the memory. A constitution of memory cell MC has already been described in the second embodiment, and hence the description is omitted here.

Two-input multiplexer MUX outputs one of two input signals A and B as output signal Y. The selection of one from two input signals A and B is controlled by data (positive signal S0 and inversion signal S1 thereof) from memory cell MC.

Here, a read from N-channel MOS transistor (nonvolatile memory) F11 is performed, for example, by applying read potential. Vread to word line WL11 in a state where the first potential node V11 is set to the supply potential and the second potential node BL11 is set to ground potential.

Read potential Vread is set so that a large current flows when N-channel MOS transistor F11 is in the erase state and a current hardly flows when N-channel MOS transistor F11 is in the write state.

Consequently, one of first and second output nodes D11 and D12 goes high (for example, attains supply potential), and the other node goes low (for example, is grounded).

Thus, the data stored in the first N-channel MOS transistor F11 in a nonvolatile manner is read, and this data is stored, in a volatile manner, in memory cell MC including first and second P-channel MOS transistors M11 and M12 and first and second N-channel MOS transistors F11 and M13.

It should be noted that in the present example, each of pass transistors T0 and T1 in two-input multiplexer MUX includes an N-channel MOS transistor, but in place of this constitution, there may be used, for example, a transfer gate including a P-channel MOS transistor and an N-channel MOS transistor.

In the above examples, a complementary signal read from the nonvolatile configuration memory is used, but another example can constitute a system in which an only positive signal from the nonvolatile configuration memory is used.

Figure 13:
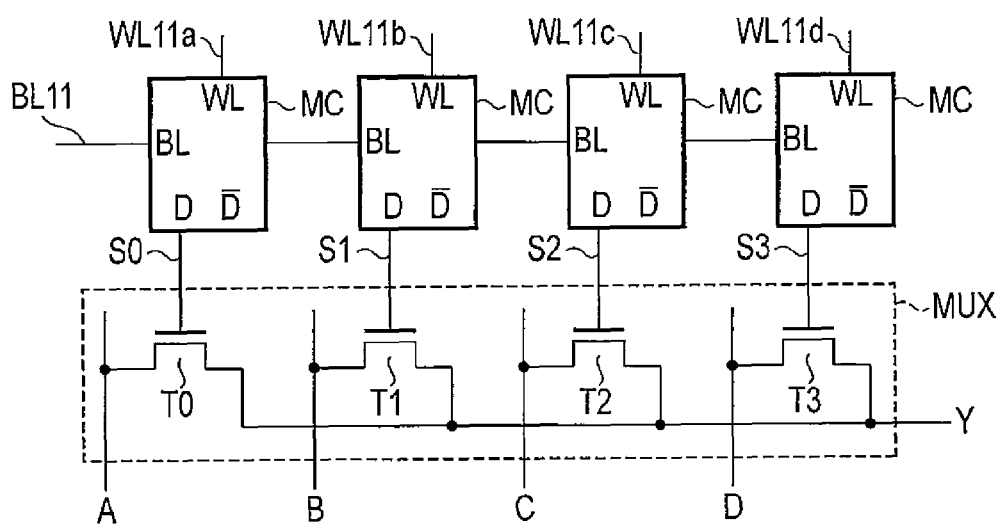

For example, an example shown in FIG. 13 constitutes a system including nonvolatile configuration memories (memory cells) MC of the second embodiment and four-input multiplexer MUX controlled by outputs (only positive signals) of the memories. A constitution of memory cell MC has already been described in the second embodiment, and hence the description is omitted here.

Four-input multiplexer MUX outputs one of four input signals A, B, C and D as output signal Y. The selection of one from four input signals A, B, C and D is controlled by data (only positive signals) S0, S1, S2 and S3 from memory cells MC.

It should be noted that in the present example, each of pass transistors T0, T1, T2 and T3 in four-input multiplexer MUX includes an N-channel MOS transistor, but in place of this constitution, there may be used, for example, a transfer gate including a P-channel MOS transistor and an N-channel MOS transistor.

FIG. 14 shows an example of a logic block constituting a logic portion of an FPGA.

Logic block BK includes, for example, lookup table LUT, flip-flop D-FF, and multiplexer MUX.

Lookup table LUT is a circuit which includes transfer gate T and configuration memories MC and which realizes a logic gate in accordance with data of configuration memories MC.

An output signal of lookup table LUT is distributed to a path (input A) through which the signal is directly input into multiplexer MUX and a path (input B) through which the signal is input into multiplexer MUX via flip-flop D-FF. Moreover, multiplexer MUX selectively outputs one of the two input signals.

FIG. 15 shows an example of the lookup table.

When configuration memories MC are used in lookup table LUT, only one of first and second output nodes of each configuration memory MC is used, and the node may be connected to the source (the drain) of transfer gate T in lookup table LUT.

That is, the nonvolatile configuration memories according to the above first and second embodiments are also very preferably used as the configuration memories of lookup table LUT. Read/write/erase of the configuration memories has already been described, and hence the description is omitted here.

Fourth Embodiment

A fourth embodiment relates to a layout and an operation method when nonvolatile configuration memories (memory cells) are arranged in the form of an array.

FIG. 16 shows a circuit diagram when a memory cell array is implemented using the memory cells according to the first embodiment.

First word lines WL11a and WL11b and second word lines WL12a and WL12b of memory cells MC extend in a first direction and are connected to control circuit 21. Control circuit 21 controls potentials of first word lines WL11a and WL11b and second word lines WL12a and WL12b in reading/writing/erasing of first and second N-channel MOS transistors (nonvolatile memories) F11 and F12.

First potential node (for example, the supply line) V11, second potential node (for example, the ground line) BL11 and third potential node (well potential line) PW11 of memory cells MC extend in a second direction which crosses the first direction, and are connected to control circuit 22. Control circuit 22 controls the potentials of first potential node V11, second potential node BL11 and third potential node PW11 in the reading/writing/erasing of first and second N-channel MOS transistors (nonvolatile memories) F11 and F12.

Next, the reading/writing/erasing will be described.

First, an erasing operation and a writing operation will be described.

Before erasing and writing, the potential of an N-type semiconductor substrate (including an N-type well region) provided with P-channel MOS transistors M11 and M12 is made to float, whereby it is possible to prevent a high potential from being applied to the gate insulating layers of the transistors.

The erase is collectively performed from memory cells MC.

That is, ground potential Vgnd is applied to first word lines WL11a and WL11b and second word lines WL12a and WL12b, and erase potential Vera (a high positive potential of, for example, 18 V) is applied to third potential node PW11. At this time, first and second potential nodes V11 and BL11 are, for example, made to float.

Consequently, electrons are extracted from storage layers of first and second N-channel MOS transistors F11 and F12 in memory cell MC, and both the transistors become the erase state.

The write is individually performed every memory cell MC.

Here, there will be described an example involving writing to left memory cell MC of FIG. 16. Moreover, the write data is high (binary 1). A high state is where the positive signal (first output node D11) from memory cell MC goes high.

For example, programming potential Vpgm (a high positive potential of, for example, 18 V) is applied to the first word line (selected word line) WL11a, and ground potential Vgnd is applied to the second word line (unselected word line) WL12a and also to the third potential node PW11.

Moreover, ground potential Vgnd is applied to the first word line (unselected word line) WL11b and the second word line (unselected word line) WL12b.

At this time, first and second potential nodes V11 and BL11 are, for example, made to float.

Consequently, electrons are implanted in a storage layer of first N-channel MOS transistor F11 in left memory cell MC of FIG. 16, and the transistor becomes a write state.

The reading is performed, for example, by applying read potential Vread (for example, 2 V) to first and second word lines WL11a and WL12a in a state where first potential node V11 is set to the supply potential and second potential node BL11 is set to ground potential.

The reading may be performed, for example, by applying first potential node V11 to the supply potential in a state where first and second word lines WL11a and WL12a is set to read potential Vread (for example, 2 V) and second potential node BL11 is set to ground potential.

Reading potential Vread is set so that a large current flows when first and second N-channel MOS transistors F11 and F12 are in the erase state and a current hardly flows when first and second N-channel MOS transistors F11 and F12 are in the write state.

In the present example, since the first N-channel MOS transistor F11 has the write state (a state where the threshold is high), the potential of first output node D11 gradually becomes high by charging through the first potential node V11, and the potential of the second output node D12 maintains a low state by discharging through the second potential node BL11.

Therefore, the first output node D11 goes high (for example, attains supply potential), and the second output node D12 goes low (for example, is grounded).

Thus, data stored in first and second N-channel MOS transistors F11 and F12 in a nonvolatile manner is read, and this data is stored, in a volatile manner, in memory cell MC including first and second P-channel MOS transistors M11 and M12 and first and second N-channel MOS transistors F11 and F12.

Moreover, multiplexer MUX is controlled by using data (output signal S0 and inversion signal S1 thereof) from memory cell MC.

Figure 17:
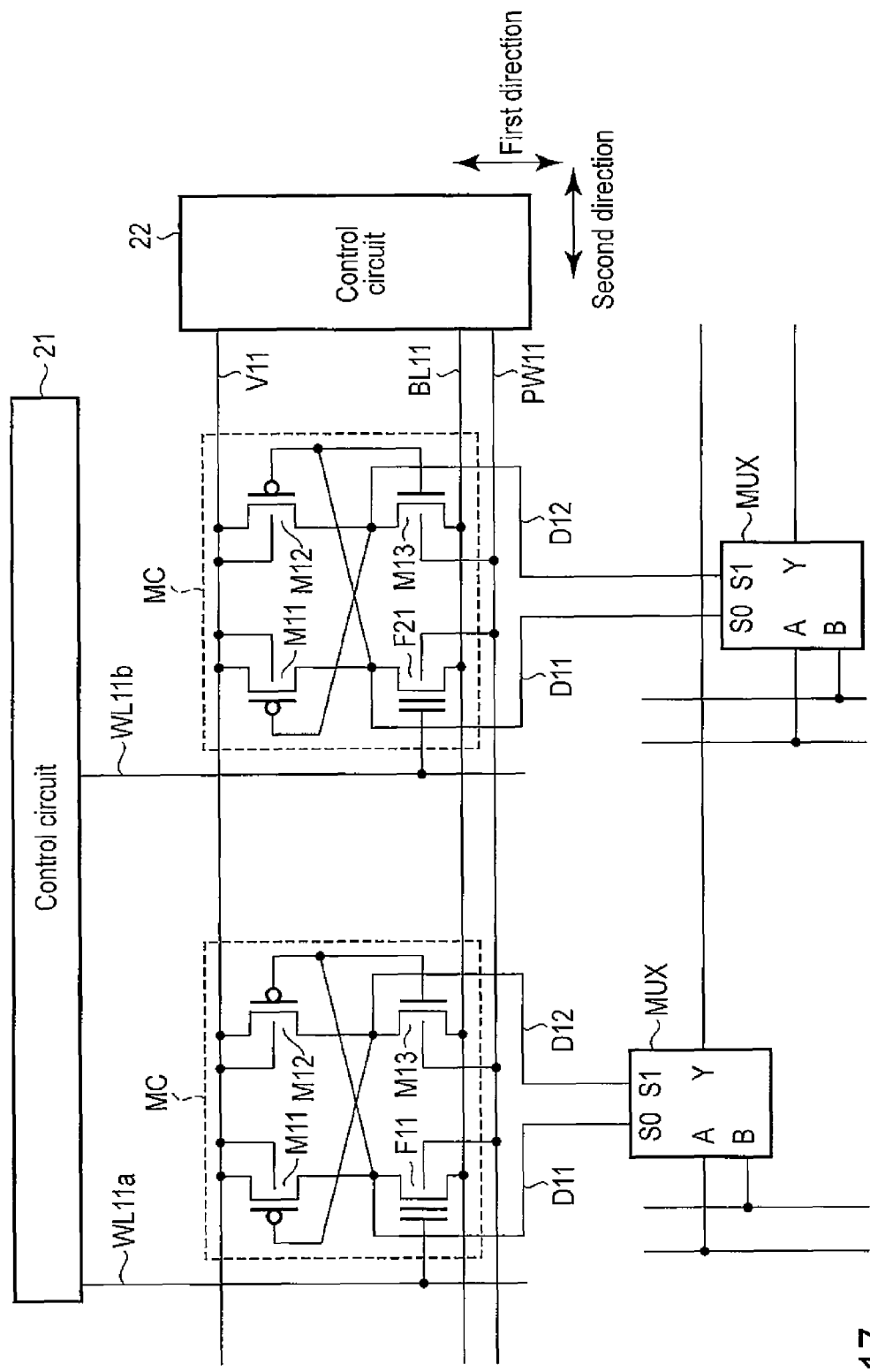

FIG. 17 shows a circuit diagram when a memory cell array is implemented using memory cells according to the second embodiment.

Word lines WL11a and WL11b of memory cells MC extend in a first direction and are connected to control circuit 21. Control circuit 21 controls the potentials of word lines WL11a and WL11b in reading/writing/erasing of first N-channel MOS transistor (nonvolatile memory) F11.

First the potential node (for example, the supply line) V11, the second potential node (for example, ground line) BL11 and the third potential node (well potential line) PW11 of memory cells MC extend in a second direction which crosses the first direction, and are connected to control circuit 22. Control circuit 22 controls the potentials of first potential node V11, second potential node BL11 and third potential node PW11 in the reading/writing/erasing of first N-channel MOS transistor (nonvolatile memory) F11.

Next, the reading/writing/erasing will be described.

First, an erasing operation and a writing operation will be described.

Before erasing and writing, the potential of an N-type semiconductor substrate (including an N-type well region) provided with P-channel MOS transistors M11 and M12 is made to float, whereby it is possible to prevent a high potential from being applied to the gate insulating layers of the transistors.

The erase is collectively performed from memory cells MC.

That is, ground potential Vgnd is applied to word lines WL11a and WL11b, and erase potential Vera (a high positive potential of, for example, 18 V) is applied to third potential node PW11. At this time, first and second potential nodes V11 and BL11 are, for example, made to float.

Consequently, electrons are extracted from a storage layer of first N-channel MOS transistor F11 in memory cell MC, and the transistor becomes an erase state.

The write is individually performed every memory cell MC.

Here, there will be described an example involving writing to left memory cell MC of FIG. 17. Moreover, the write data is high (binary 1).

For example, programming potential Vpgm (a high positive potential of, for example, 18 V) is applied to word line (selected word line) WL11a, and ground potential Vgnd is applied to third potential node PW11. Moreover, ground potential Vgnd is applied to word line (unselected word line) WL11b.

At this time, first and second potential nodes V11 and BL11 are, for example, made to float.

Consequently, electrons are implanted in the storage layer of first N-channel MOS transistor F11 in left memory cell MC of FIG. 17, and the transistor becomes a write state.

The reading is performed, for example, by applying read potential Vread (for example, 2 V) to word line WL11a in a state where first potential node V11 is set to the supply potential and second potential node BL11 is set to ground potential.

In the present example, since first N-channel MOS transistor F11 has the write state (a state where the threshold is high), the potential of first output node D11 gradually becomes high by charging through first potential node V11, and the potential of second output node D12 maintains a low state by discharging through second potential node BL11.

Therefore, first output node D11 goes high (for example, attains supply potential), and second output node D12 goes low (for example, is grounded).

Thus, data stored in first N-channel MOS transistor F11 in a nonvolatile manner is read, and this data is stored, in a volatile manner, in memory cell MC including first and second P-channel MOS transistors M11 and M12 and first and second N-channel MOS transistors F11 and M13.

Moreover, multiplexer MUX is controlled by using data (output signal S0 and inversion signal S1 thereof) from memory cell MC.

FIG. 18 is a modification example of the memory cell array of FIG. 16.

Characteristics of this memory cell array lie in that as to nonvolatile configuration memories (memory cells) MC arranged in a first direction, second and third potential nodes BL11 and PW11 are shared, and P-type well region P-well provided with the first and second N-channel MOS transistors (the nonvolatile memories) is shared.

In this case, two memory cells MC arranged in the first direction are preferably laid out symmetrically with each other.

It should be noted that also as to the memory cell array of FIG. 17, second and third potential nodes BL11 and PW11 and P-type well region P-well provided with the first and second N-channel MOS transistors (the nonvolatile memories) may be shared by memory cells MC arranged in the first direction in the same manner as in the constitution of FIG. 18.

CONCLUSION

According to the embodiments, it is possible to realize a nonvolatile configuration memory with low power requirements and of small area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile configuration memory comprising:
   first and second output nodes;
   a first P-channel FET having a gate connected to the second output node, a source applied to a first potential, and a drain connected to the first output node;
   a second P-channel FET having a gate connected to the first output node, a source applied to the first potential, and a drain connected to the second output node;
   a first N-channel FET having a control gate connected to a first word line, a source applied to a second potential lower than the first potential, a drain connected to the first output node, and a storage layer which stores data in a nonvolatile manner; and
   a second N-channel FET having a control gate connected to a second word line, a source applied to the second potential, a drain connected to the second output node, and a storage layer which stores data in a nonvolatile manner, wherein threshold values of the first and second N-channel FETs change in according to the data stored in the first and second N-channel FETs respectively.

2. The memory of claim 1, further comprising:
a control circuit which writes complementary data to the storage layers of the first and second N-channel FETs by applying a programming potential to one of the first and second word lines.

3. The memory of claim 1, further comprising:
a P-type well in which the first and second N-channel FETs are formed and to which a third potential as a back gate potential thereof is applied.

4. The memory of claim 1, further comprising:
an FET connected to a portion between the first output node and the second output node, to equalize potentials of both the nodes.

5. The memory of claim 1,
wherein the first potential is applied as a back gate potential of the first and second P-channel FETs.

6. The memory of claim 1, further comprising:
a control circuit which reads data stored in the first and second N-channel FETs in the nonvolatile manner by applying a read potential to the first and second word lines, and controls an operation of latching data from the first and second N-channel FETs in an unit, wherein the unit includes the first and second P-channel FETs and the first and second N-channel FETs.

7. The memory of claim 1,
wherein the control gate of the first N-channel FET is not connected to the second output node, and the control gate of the second N-channel FET is not connected to the first output node.

8. A nonvolatile configuration memory comprising:
first and second output nodes;
a first P-channel FET having a gate connected to the second output node, a source applied to a first potential, and a drain connected to the first output node;
a second P-channel FET having a gate connected to the first output node, a source applied to the first potential, and a drain connected to the second output node;
a first N-channel FET having a control gate connected to a word line, a source applied to a second potential lower than the first potential, a drain connected to the first output node, and a storage layer which stores data in a nonvolatile manner, wherein a threshold value of the first N-channel FET changes in accordance with the data stored in the first N-channel FET;
a second N-channel FET having a gate connected to the first output node, a source applied to a third potential lower than the first potential, and a drain connected to the second output node; and
a P-type well in which the first N-channel FET is formed and to which a fourth potential as a back gate potential thereof is applied.

9. The memory of claim 8, wherein the source of the first N-channel FET is connected to a first conductive line, the source of the second N-channel FET is connected to a second conductive line, the P-type well is connected to a third conductive line, and the first, second and third conductive lines are independent of one another.

10. A nonvolatile configuration memory comprising:
first and second output nodes;
a first P-channel FET having a gate connected to the second output node, a source applied to a first potential, and a drain connected to the first output node;
a second P-channel FET having a gate connected to the first output node, a source applied to the first potential, and a drain connected to the second output node;
a first N-channel FET having a control gate connected to a word line, a source applied to a second potential lower than the first potential, a drain connected to the first output node, and a storage layer which stores data in a nonvolatile manner, wherein a threshold value of the first N-channel FET changes in accordance with the data stored in the first N-channel FET;
a second N-channel FET having a gate connected to the first output node, a source applied to a third potential lower than the first potential, and a drain connected to the second output node; and
an FET connected to a portion between the first output node and the second output node, to equalize potentials of both the nodes.

11. A nonvolatile configuration memory comprising:
first and second output nodes;
a first P-channel FET having a gate connected to the second output node, a source applied to a first potential, and a drain connected to the first output node;
a second P-channel FET having a gate connected to the first output node, a source applied to the first potential, and a drain connected to the second output node;
a first N-channel FET having a control gate connected to a word line, a source applied to a second potential lower than the first potential, a drain connected to the first output node, and a storage layer which stores data in a nonvolatile manner, wherein a threshold value of the first N-channel FET changes in accordance with the data stored in the first N-channel FET; and
a second N-channel FET having a gate connected to the first output node, a source applied to a third potential lower than the first potential, and a drain connected to the second output node,
wherein a resistance of the second N-channel FET is between a resistance of a write state and a resistance of an erase state of the first N-channel FET.

* * * * *